(12) United States Patent
Kim et al.

(10) Patent No.: US 12,238,923 B2
(45) Date of Patent: *Feb. 25, 2025

(54) METHOD OF FORMING CONTACT INCLUDED IN SEMICONDUCTOR DEVICE

(71) Applicant: Samsung Electronics Co., Ltd., Suwon-si (KR)

(72) Inventors: Suncheul Kim, Hwaseong-si (KR); Donghyun Lee, Gwacheon-si (KR); Uihyoung Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/524,794

(22) Filed: Nov. 30, 2023

(65) Prior Publication Data

US 2024/0098986 A1 Mar. 21, 2024

Related U.S. Application Data

(63) Continuation of application No. 17/568,117, filed on Jan. 4, 2022, now Pat. No. 11,871,563.

(30) Foreign Application Priority Data

Jun. 29, 2021 (KR) .......................... 10-2021-0084676

(51) Int. Cl.
*H10B 12/00* (2023.01)
(52) U.S. Cl.
CPC ................... *H10B 12/485* (2023.02)

(58) Field of Classification Search
CPC ..................................................... H10B 12/485
USPC ................................................. 438/475, 775
See application file for complete search history.

(56) References Cited

U.S. PATENT DOCUMENTS

| | | | |
|---|---|---|---|
| 6,153,515 A | 11/2000 | Murakami et al. | |
| 9,576,896 B2 | 2/2017 | Liao et al. | |
| 11,871,563 B2 * | 1/2024 | Kim | H10B 12/485 |
| 2009/0149020 A1 | 6/2009 | Hayashi et al. | |
| 2019/0164747 A1 | 5/2019 | Chang et al. | |
| 2020/0277315 A1 | 9/2020 | Sanchez et al. | |

FOREIGN PATENT DOCUMENTS

| | | |
|---|---|---|
| JP | 3767429 B2 | 4/2006 |
| JP | 4672697 B2 | 4/2011 |

OTHER PUBLICATIONS

Notice of Allowance issued Aug. 23, 2023 in U.S. Appl. No. 17/568,117.

* cited by examiner

*Primary Examiner* — Hoai V Pham
(74) *Attorney, Agent, or Firm* — Harness, Dickey & Pierce, P.L.C.

(57) ABSTRACT

A contact forming method may include providing a semiconductor substrate including a silicon oxide film to an interior of a chamber, subjecting a surface of the silicon oxide film to plasma nitrification treatment, supplying a source gas including $TiCl_4$ and $H_2$ onto the silicon oxide film subjected to the plasma nitrification treatment, and forming a barrier layer by igniting a plasma using the source gas.

10 Claims, 13 Drawing Sheets

METHOD OF FORMING CONTACT INCLUDED IN SEMICONDUCTOR DEVICE

CROSS-REFERENCE TO THE RELATED APPLICATIONS

This application is a Continuation of U.S. application Ser. No. 17/568,117, filed on Jan. 4, 2022, which claims priority from Korean Patent Application No. 10-2021-0084676, filed on Jun. 29, 2021, in the Korean Intellectual Property Office, the entire contents of each of which are incorporated herein by reference.

BACKGROUND

1. Field

The example embodiments of the disclosure relate to a method of forming a contact included in a semiconductor device and/or electronic device.

2. Description of the Related Art

Research on technologies for controlling a resistance-capacitance delay (RC delay) of a DRAM device is being conducted. The RC delay time required in a DRAM device may be varied in accordance with a configuration of the DRAM device. To this end, technology capable of finely adjusting RC delay is needed.

SUMMARY

The example embodiments of the disclosure provide a method for adjusting a thickness of a dielectric layer formed together with a contact upon formation of the contact.

A method of forming a contact in accordance with an example embodiment of the disclosure may include providing a semiconductor substrate including a silicon oxide film to an interior of a chamber; subjecting a surface of the silicon oxide film to plasma nitrification treatment; supplying a source gas including $TiCl_4$ and $H_2$ onto the silicon oxide film subjected to the plasma nitrification treatment; and forming a barrier Larrier by igniting a plasma using the source gas.

A method of forming a contact in accordance with an example embodiment of the disclosure may include forming an interlayer insulating layer on a semiconductor substrate, the semiconductor substrate including a transistor; forming a contact hole by etching the interlayer insulating layer; subjecting the interlayer insulating layer to plasma nitrification treatment; supplying a source gas including $TiCl_4$ and $H_2$ onto the interlayer insulating layer subjected to the plasma nitrification treatment; forming a barrier lay by igniting a plasma using the source gas; and forming a metal layer on the barrier layer.

A method of forming a contact in accordance with an example embodiment of the disclosure may include forming an interlayer insulating layer on a semiconductor substrate, the semiconductor substrate including a transistor; forming a contact hole by etching the interlayer insulating layer; forming a $TiO_2$ layer on the interlayer insulating layer by supplying a source gas including $TiCl_4$ and $H_2$ onto the interlayer insulating layer; forming a barrier layer by igniting a plasma using the source gas; and forming a metal layer on the barrier layer. The forming the $TiO_2$ layer may include adjusting a thickness of the $TiO_2$ layer by adjusting a partial pressure of the $TiCl_4$ to a level and maintaining the level.

DETAILED DESCRIPTION OF EXEMPLARY EMBODIMENTS

When the terms "about" or "substantially" are used in this specification in connection with a numerical value, it is intended that the associated numerical value includes a manufacturing tolerance (e.g., ±10%) around the stated numerical value. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
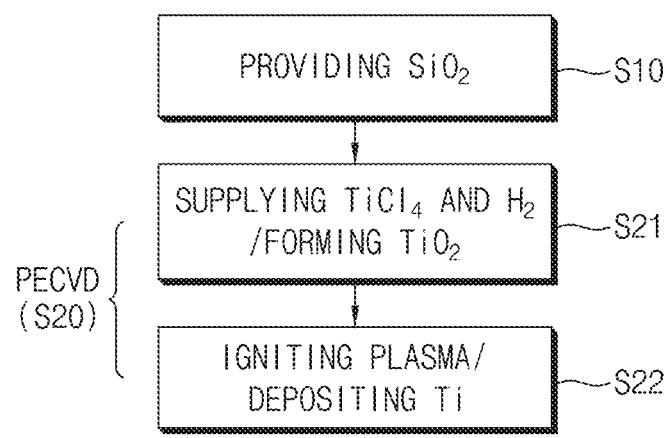
FIG. 1 is a flowchart of a method of forming a dielectric layer and a barrier layer on a silicon oxide film in accordance with some example embodiments.
Figure 2A:
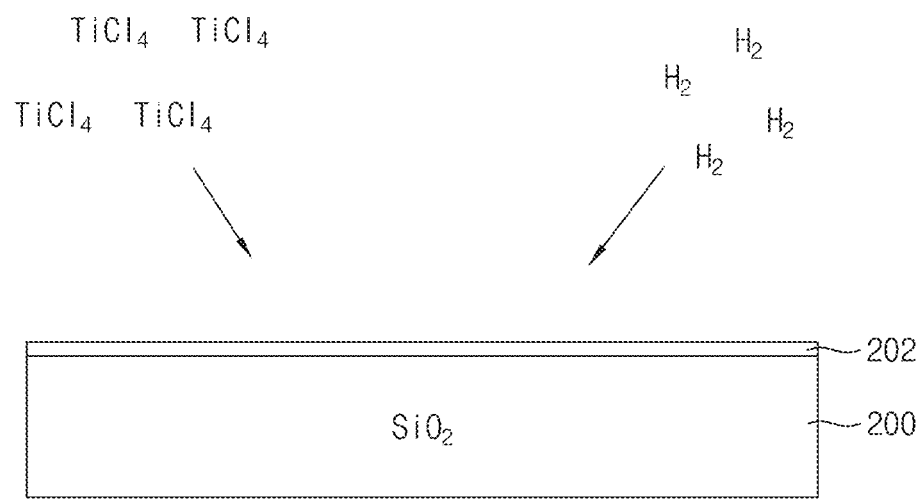
FIGS. 2A and 2B are concept views schematically shown to explain the method of FIG. 1.
Figure 2B:
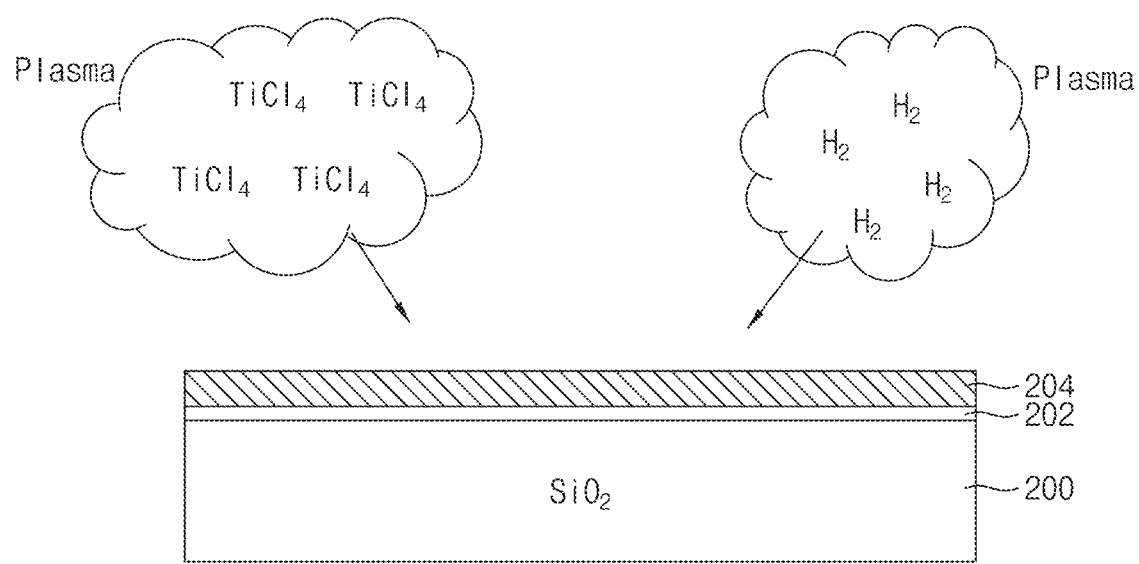

FIG. 1 is a flowchart of a method of forming a dielectric layer and a barrier layer on a silicon oxide film in accordance with some example embodiments. FIGS. 2A and 2B are concept views schematically shown to explain the method of FIG. 1.

Referring to FIGS. 1, 2A and 2B, the method may include providing a semiconductor substrate including a silicon oxide (e.g., $SiO_2$) film 200 to an interior of a chamber (S10), and performing a plasma enhanced chemical vapor deposition (PECVD) process on the silicon oxide film 200 (S20). Though the semiconductor substrate is illustrated as including silicon oxide, in some example embodiments, the semiconductor substrate may include other oxides. For example, the oxide may be an insulating oxide of the semiconductor included in semiconductor substrate.

The PECVD process S20 may include supplying $TiCl_4$ and $H_2$, which are source gases, to an interior of the chamber (S21), and igniting a plasma, thereby forming a barrier layer 204 (S22). In some example embodiments, the supply of $TiCl_4$ and $H_2$, which are source gases, to the interior of the chamber may include forming a dielectric layer 202 on the silicon oxide film 200. For example, before forming the barrier layer 204 (which may be a Ti layer) the source gases (e.g., TiCl$_4$ and H$_2$) may be supplied to the interior of the chamber (e.g., before plasma ignition). The PECVD process S20 may be performed at about 400° C. or more. When the source gases, are supplied to the interior of the chamber, which is maintained at 400° C. or more, TiCl$_4$ and H$_2$ may react with the silicon oxide film 200 and, as such, a TiO$_2$ layer (e.g., the dielectric layer 202) may be formed on the silicon oxide film 200 in accordance with Reaction Formula 1 as follows:

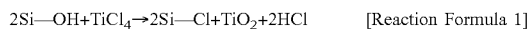

2Si—OH+TiCl$_4$→2Si—Cl+TiO$_2$+2HCl     [Reaction Formula 1]

In these cases, the thickness of the formed TiO$_2$ layer may be varied in accordance with a partial pressure of TiCl$_4$ supplied to the interior of the chamber. For example, the thickness of the TiO$_2$ layer may be thin when the partial pressure of TiCl$_4$ supplied to the interior of the chamber is low and constant. As variations in the partial pressure of TiCl$_4$ supplied to the interior of the chamber increases, and the partial pressure of TiCl$_4$ increases, the resulting TiO$_2$ layer may be formed to be thicker.

When a TiO$_2$ layer, which is a high dielectric material, is formed to a thickness not smaller than a determined (or alternatively a predetermined) thickness upon formation of a contact used in a semiconductor device, resistance-capacitance (RC) delay of the resultant semiconductor device may become excessively greater than a required (and/or otherwise determined) value. As a result, there may be a problem in reliability of the semiconductor device. To this end, the partial pressure of TiCl$_4$ supplied upon supply of the source gases may be adjusted to a determined (or alternatively a predetermined) level and, as such, the thickness of the TiO$_2$ layer may be adjusted to a desired thickness. In accordance with adjustment of the partial pressure of TiCl$_4$, it may be possible to adjust the thickness of the TiO$_2$ layer within about 3 Å to 6 Å. For example, in order to form the TiO$_2$ layer to have a thickness of about 3 Å to 6 Å, the partial pressure of TiCl$_4$ may be adjusted such that the partial pressure ratio TiCl$_4$/H$_2$ of TiCl$_4$ and H$_2$ is in a range of 1/750 to 1/250.

After the TiO$_2$ layer (e.g., the dielectric layer 202) is formed on the silicon oxide film 200, and as TiCl$_4$ and H$_2$, which are source gases, are being supplied to the interior of the chamber, a plasma may be formed through plasma ignition of the residual TiCl$_4$ not taking part in the reaction forming the TiO$_2$ layer. As the plasma is formed using the source gases (e.g., TiCl$_4$ and H$_2$) a Ti layer (e.g., the barrier layer 204) may be deposited on TiO$_2$.

Figure 3:
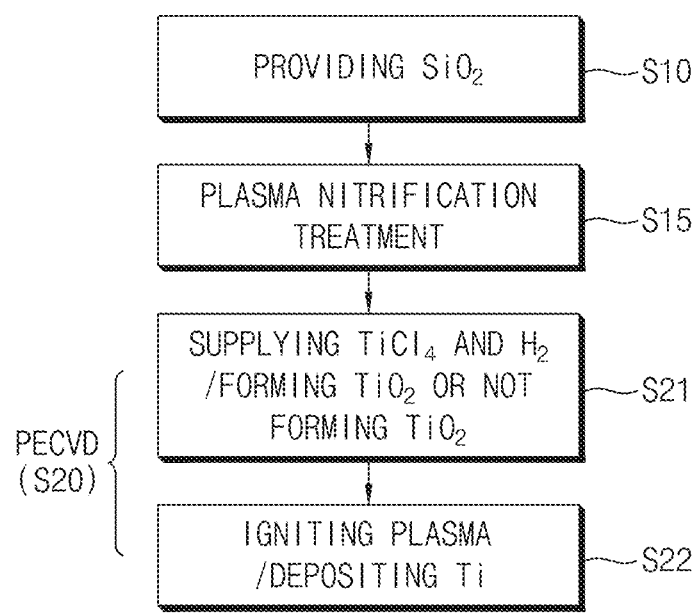
FIG. 3 is a flowchart of a method for forming a dielectric layer and a barrier layer on a silicon oxide film in accordance with some example embodiments.

FIG. 3 is a flowchart of a method for forming a dielectric layer and a barrier layer on a silicon oxide film in accordance with some example embodiments. FIGS. 4A, 4B, 4C, and 4D are concept views schematically shown to explain the method of FIG. 3.

Referring to FIG. 3, the method may further include subjecting a surface of the silicon oxide film 200 (e.g., as described with reference to FIGS. 1, 2A and 2B) to plasma nitrification treatment before execution of the plasma enhanced chemical vapor deposition (PECVD) process on the silicon oxide film 200 (S15). The plasma nitrification treatment for the silicon oxide film 200 may be performed before execution of the PECVD process (S20) (e.g., before the formation of the barrier layer 204). In some example embodiments, for example, the plasma nitrification treatment of the silicon oxide film 200 may be performed before the source gases (e.g., TiCl$_4$ and H$_2$) are supplied to the interior of the chamber (and/or before a TiO$_2$ layer is formed).

The plasma nitrification treatment for the surface of the silicon oxide film 200 may be induction of SiO$_2$—N coupling through mixture of the silicon oxide film 200 and nitrogen. For example, the plasma nitrification treatment may be performed in a direct plasma manner at a temperature of 400° C. to 500° C. and a pressure of 4 to 6 Torr in an atmosphere containing NH$_3$, Ar, and H$_2$ as source gases in a reaction space of the chamber.

After the surface of the silicon oxide film 200 is subjected to the plasma nitrification treatment (S15), the PECVD process described with reference to FIG. 1 may be performed (S20). For example, first, TiCl$_4$ and H$_2$ may be supplied to the interior of the chamber (S21).

Figure 4A:
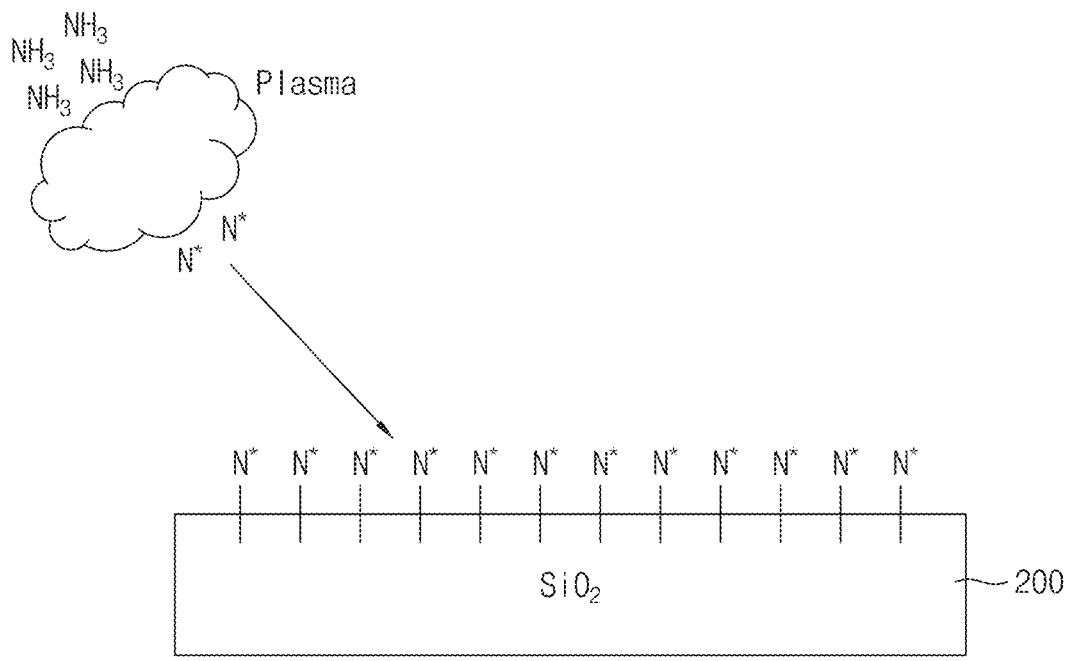
FIGS. 4A, 4B, 4C, and 4D are concept views schematically shown to explain the method of FIG. 3.
Figure 4B:
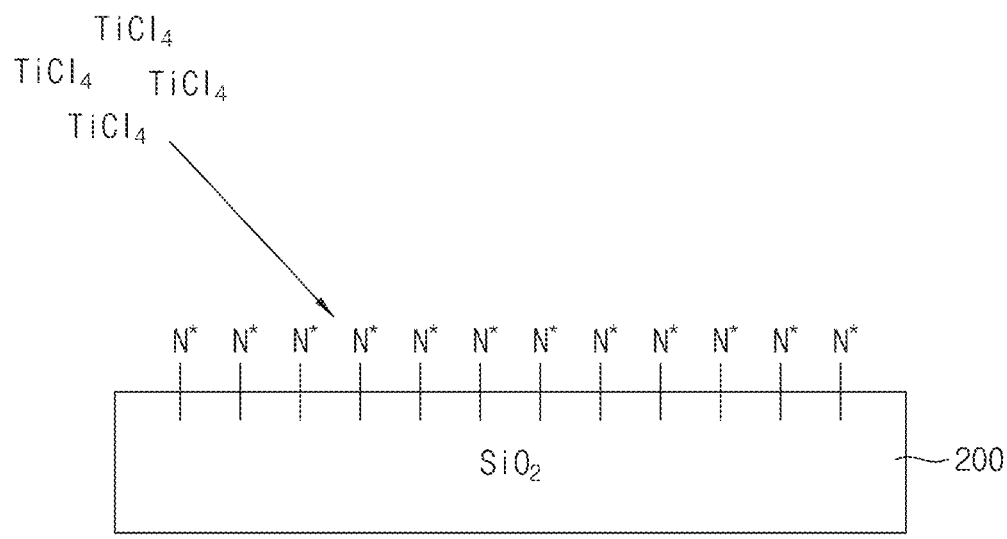

Although a TiO$_2$ layer, which is the dielectric layer 202, may be formed through reaction of TiCl$_4$ with the silicon oxide film 200, as described above, the reaction amount between the silicon oxide film 200 and TiCl$_4$ may be reduced because the surface of the silicon oxide film 200 has been subjected to the nitrification treatment. As shown in FIG. 4B, the nitrogen coupled to the surface of the silicon oxide film 200 may function as a protective layer for the surface of the silicon oxide film 200, thereby suppressing reaction between the silicon oxide film 200 and TiCl$_4$. As a result, the thickness of the formed TiO$_2$ layer may be reduced.

In some example embodiments, after the plasma nitrification treatment of the surface of the silicon oxide film 200, the partial pressures of TiCl$_4$ and H$_2$ may be controlled to be determined (or alternatively a predetermined) levels while being constant, as described with reference to FIG. 1, and the resultant TiCl$_4$ and H$_2$ may be supplied to the interior of the chamber. In these cases, when TiCl$_4$ and H$_2$ are supplied under the condition that the partial pressure ratio TiCl$_4$/H$_2$ of TiCl$_4$ and H$_2$ is in a range of 1/750 to 1/250, the thickness of the TiO$_2$ layer may be adjusted to be in a range of about 0 to 2.5 Å. For example, when the partial pressure ratio of TiCl$_4$ and H$_2$ is adjusted after the plasma nitrification treatment, it may be possible to reduce the thickness of the TiO$_2$ layer to 2.5 Å or less and/or to completely prevent formation of TiO$_2$. As such, it may be possible to minimize RC delay by preventing formation of a TiO$_2$ layer and/or reducing the thickness of the TiO$_2$ layer upon forming a contact of a semiconductor device.

In some example embodiments, after the plasma nitrification treatment for the surface of the silicon oxide film 200, TiCl$_4$ may be supplied without adjustment of the partial pressure thereof. When TiCl$_4$ is supplied without adjustment of the partial pressure thereof, the partial pressure of TiCl$_4$ in the chamber may be varied without being constant during a period from a time immediately after TiCl$_4$ is supplied to a time before plasma ignition occurs. Furthermore, the partial pressure ratio TiCl$_4$/H$_2$ of TiCl$_4$ and H$_2$ may be between 1/250 to 1/750. For example, when the partial pressure of TiCl$_4$ is not adjusted, the partial pressure ratio TiCl$_4$/H$_2$ of TiCl$_4$ and H$_2$ supplied to the interior of the chamber may be 1/250 to 1/150. In these cases, the thickness of the formed TiO$_2$ may be about 3 to 8 Å.

Thereafter, plasma ignition may be performed for residual TiCl$_4$ and H$_2$, thereby depositing the barrier layer 204 (e.g., a Ti layer) on the dielectric layer 202 (e.g., a TiO$_2$ layer), and/or the silicon oxide film 200 (S22).

Figure 4C:
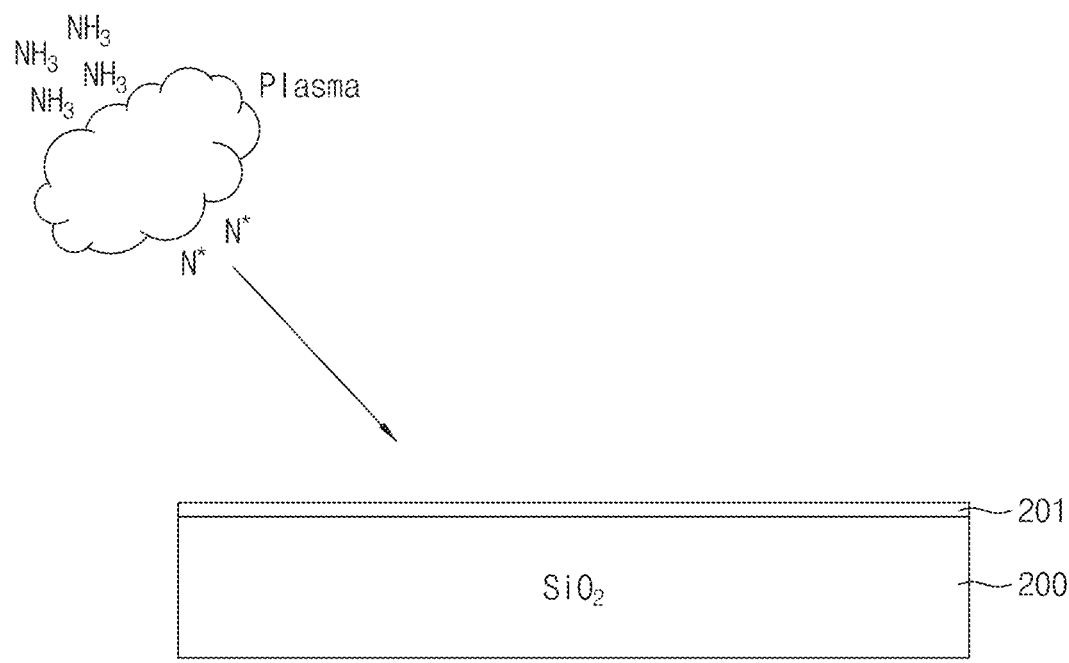
Figure 4D:
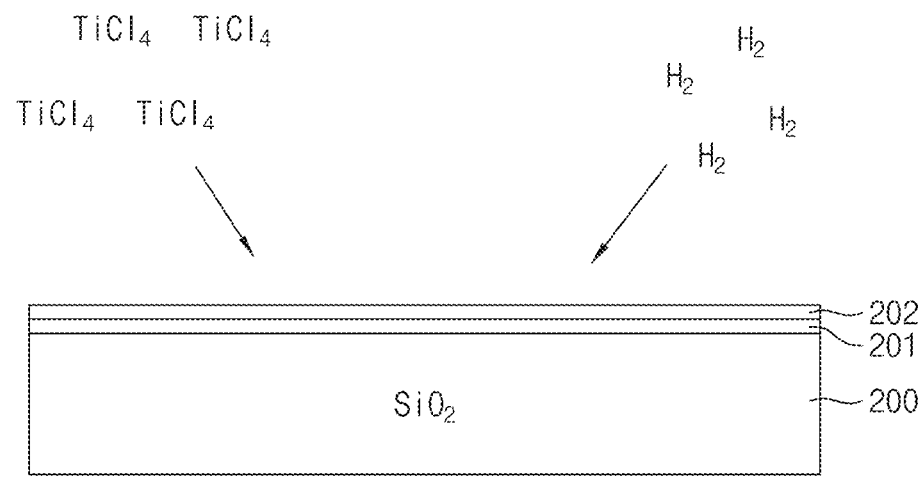

Referring to FIGS. 4C and 4D, in some example embodiments, a silicon oxynitride ("SiON") layer 201 may be further formed on the silicon oxide film 200 by plasma nitrification treatment. After the plasma nitrification treatment, a dielectric layer 202 (e.g., a TiO$_2$ layer) may be formed on the SiON layer 201 by supplying TiCl$_4$ and H$_2$. Subsequently, a barrier layer 204 (e.g., a Ti layer) may be deposited through plasma ignition. In some example embodiments, when the dielectric layer 202 is not formed, the barrier layer 204 may be deposited on the SiON layer 201.

Figure 5:
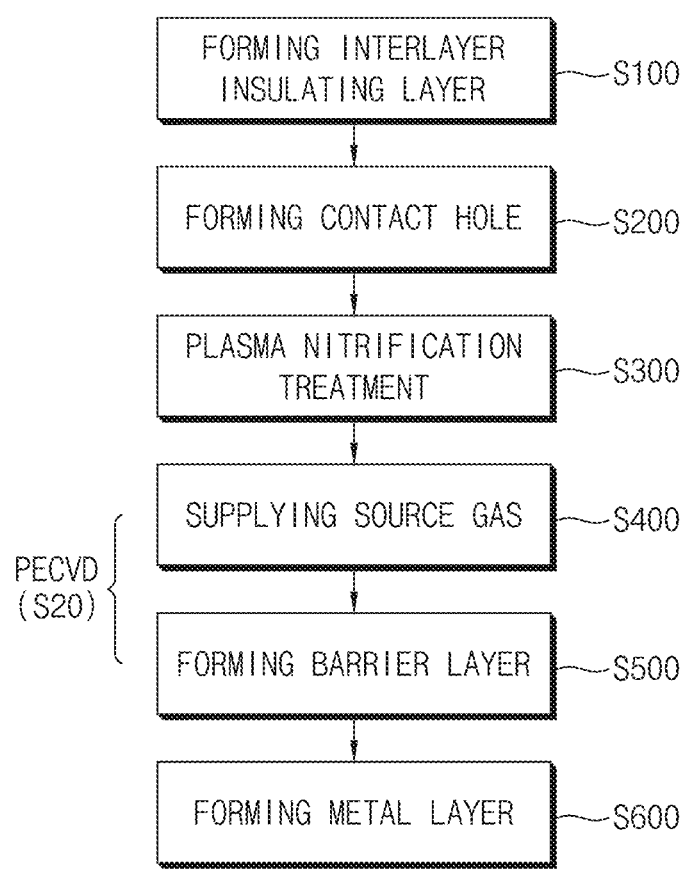
FIG. 5 is a flowchart explaining a method for forming a contact of a semiconductor device in accordance with some example embodiments.

FIG. 5 is a flowchart explaining a method for forming a contact of a semiconductor device in accordance with some example embodiments. FIGS. 6 to 11 are sectional views explaining the method of FIG. 5.

Referring to FIGS. 5 to 9, the method may include forming an interlayer insulating layer 200 on a semiconductor substrate 100 (S100), forming a contact hole H (S200), performing plasma nitrification treatment (S300), supplying a source gas (S400), forming barrier layers 204 and 206 (S500), and forming a metal layer 208 (S600).

Figure 6:
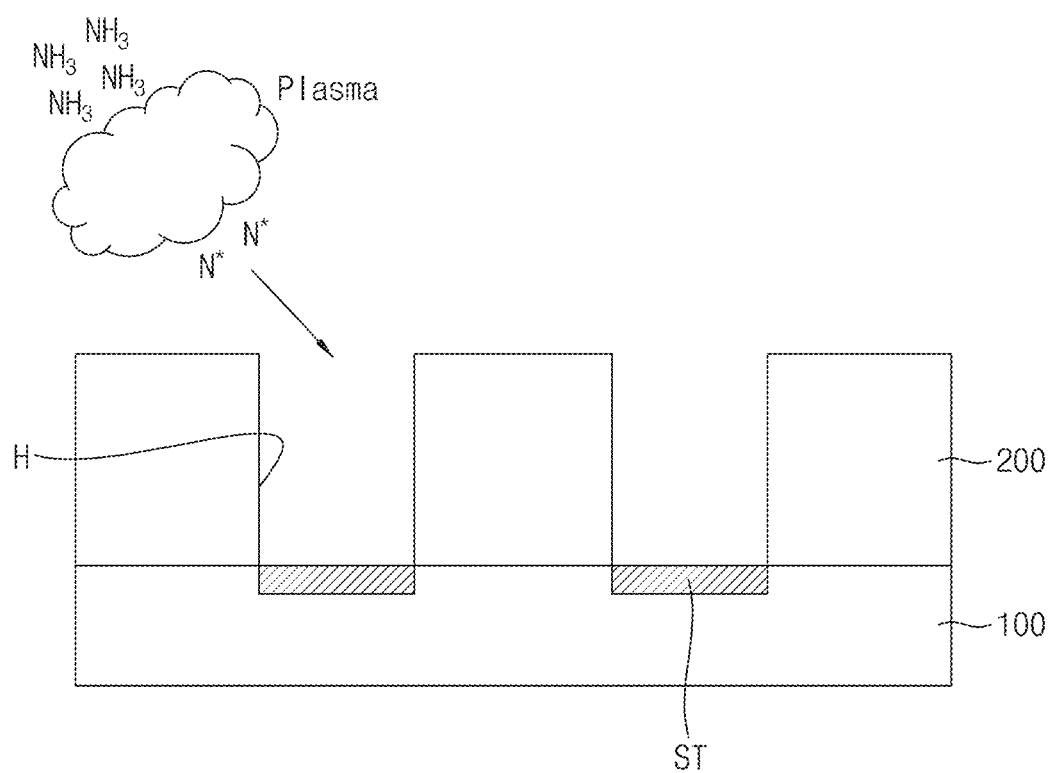
FIGS. 6 to 11 are sectional views explaining the method of FIG. 5.

Referring to FIGS. 5 and 6, the interlayer insulating layer 200 may be formed by depositing an oxide (e.g., silicon oxide) on the semiconductor substrate 100 (S100). Although omitted from FIGS. 6 to 9, for convenience of description, the semiconductor substrate 100 may be provided with a structure such as a transistor having impurity regions as a source region and a drain region. A structure, such as a bit line, a bit line contact, a storage node contact, a landing pad, and/or a capacitor, which is electrically to the transistor, may be provided on the semiconductor substrate 100. The interlayer insulating layer 200 may be formed on the above-described structures.

A contact hole H, which exposes a lower conductive layer ST, may be formed by etching the interlayer insulating layer 200 (S200). For example, the lower conductive layer ST may be a source/drain contact connected to a source/drain region of a transistor provided at the semiconductor substrate 100, a wiring layer such as a bit line, and/or a plate electrode (and/or an upper electrode) included in a capacitor.

Plasma nitrification treatment may be performed on the interlayer insulating layer 200 formed with the contact hole H (S300). The plasma nitrification treatment may be performed in the same manner as the plasma nitrification treatment described with reference to FIGS. 3 and 4A. For example, nitrogen in a plasma state may be introduced to a surface of the interlayer insulating layer 200 (which may be, e.g., a silicon oxide film), and, as such, a $SiO_2$—N coupling may be induced. In some example embodiments, the plasma nitrification treatment may be performed in a direct plasma manner at a temperature of 400° C. to 500° C. and a pressure of 4 to 6 Torr in an atmosphere containing $NH_3$, Ar, and $H_2$ in a reaction space of the chamber.

Figure 7:
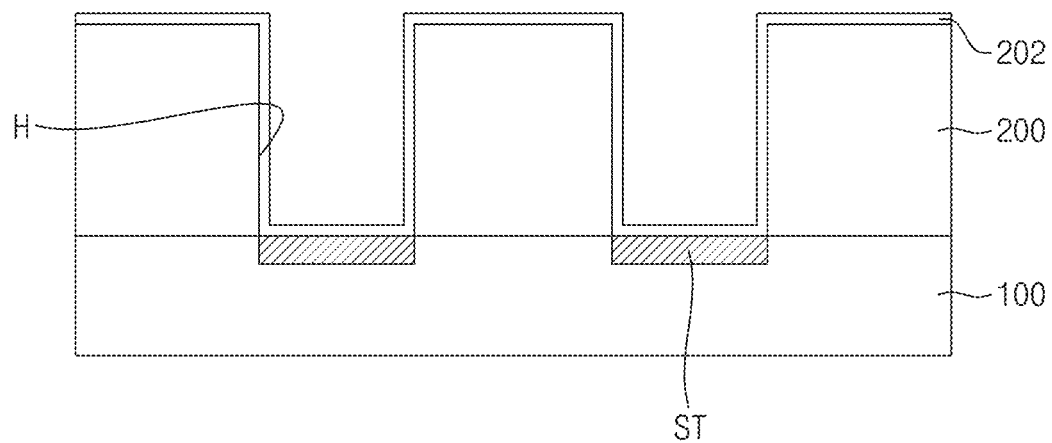

Referring to FIGS. 5 and 7, a source gas for a PECVD process (S20) may be supplied in the chamber and/or onto the interlayer insulating layer 200, the surface of which has been subjected to the plasma nitrification treatment. Supply of the source gas may be performed in the same manner as described with reference to FIG. 1 or 3. For example, $TiCl_4$ and $H_2$ may be supplied onto the interlayer insulating layer 200 subjected to the plasma nitrification treatment, as source gases of the PECVD process. As $TiCl_4$ is supplied to the interior of the chamber before formation of a plasma, and the internal temperature of the chamber is maintained at 400° C. or more, $TiCl_4$ may react with the interlayer insulating layer 200, and, as such, a dielectric layer 202 (e.g., a $TiO_2$ layer) may be formed.

In some example embodiments, when $TiCl_4$ and $H_2$ are supplied to the interior of the chamber under the condition that the partial pressure ratio $TiCl_4/H_2$ of $TiCl_4$ and $H_2$ is adjusted to be 1/750 to 1/250, after the plasma nitrification treatment for the surface of the interlayer insulating layer 200, the $TiO_2$ layer, which is the dielectric layer 202, may be formed to have a thickness of 0 to 2.5 Å. For example, the dielectric layer 202 may not be formed or may be formed to have a thickness exceeding 0 Å, but not more than 2.5 Å.

In some example embodiments, formation of the dielectric layer 202 may not include adjusting the partial pressure of $TiCl_4$. When $TiCl_4$ is supplied without adjustment of the partial pressure thereof, the partial pressure of $TiCl_4$ in the chamber may be varied during a period from a time immediately after $TiCl_4$ is supplied to a time before plasma ignition occurs. Furthermore, the partial pressure ratio $TiCl_4/H_2$ of $TiCl_4$ and $H_2$ may be between 1/750 to 1/250. For example, when the partial pressure of $TiCl_4$ is not adjusted, the partial pressure ratio $TiCl_4/H_2$ of $TiCl_4$ and $H_2$ supplied to the interior of the chamber may be 1/250 to 1/150. In these cases, the thickness of the formed $TiO_2$ may be about 3 Å to 8 Å. As such, it may be possible to minimize RC delay occurring due to a $TiO_2$ layer, which is included in a contact in a semiconductor device using the contact, by preventing formation of the $TiO_2$ layer and/or reducing the thickness of the $TiO_2$ layer.

Figure 8:
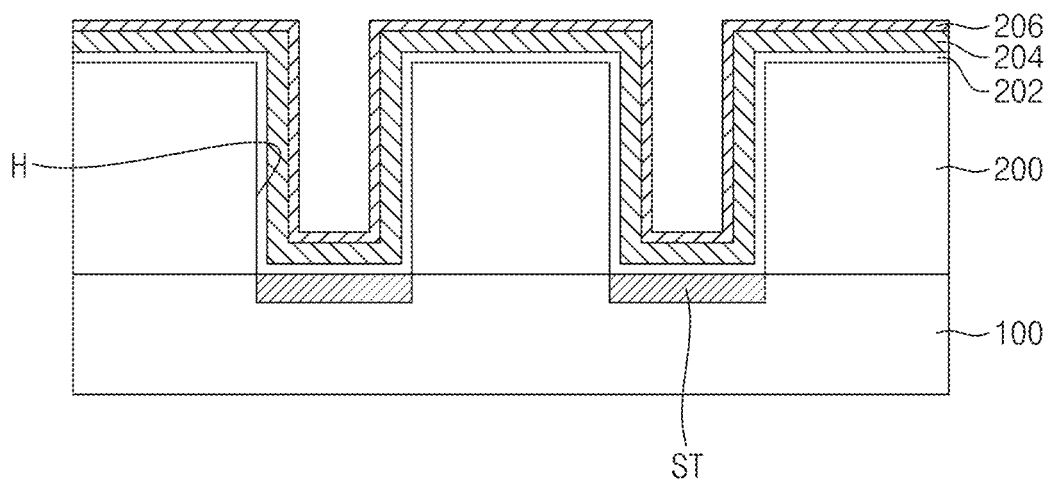

Referring to FIGS. 5 and 8, barrier layers 204 and 206 may be formed on the dielectric layer 202. Formation of the barrier layers 204 and 206 may include forming a first barrier layer 204, and forming a second barrier layer 206. Formation of the first barrier layer 204 may be performed in the same manner as formation of the barrier layer 204 described with reference to FIGS. 1 and 3. A plasma may be formed through plasma ignition of residual $TiCl_4$ not taking part in reaction for formation of the $TiO_2$ layer. As the plasma is formed using $TiCl_4$ and $H_2$ as source gases, a Ti layer, which may be at least one of barrier layer 202 and/or 204, may be deposited on $TiO_2$. In some example embodiments, the dielectric layer 202 may be omitted, and the first barrier layer 204 may be directly formed on the interlayer insulating layer 200.

The second barrier layer 206 may be formed on the first barrier layer 204, and the second barrier layer 206, which may be a TiN layer, may be formed through thermal chemical vapor deposition (CVD).

Figure 9:
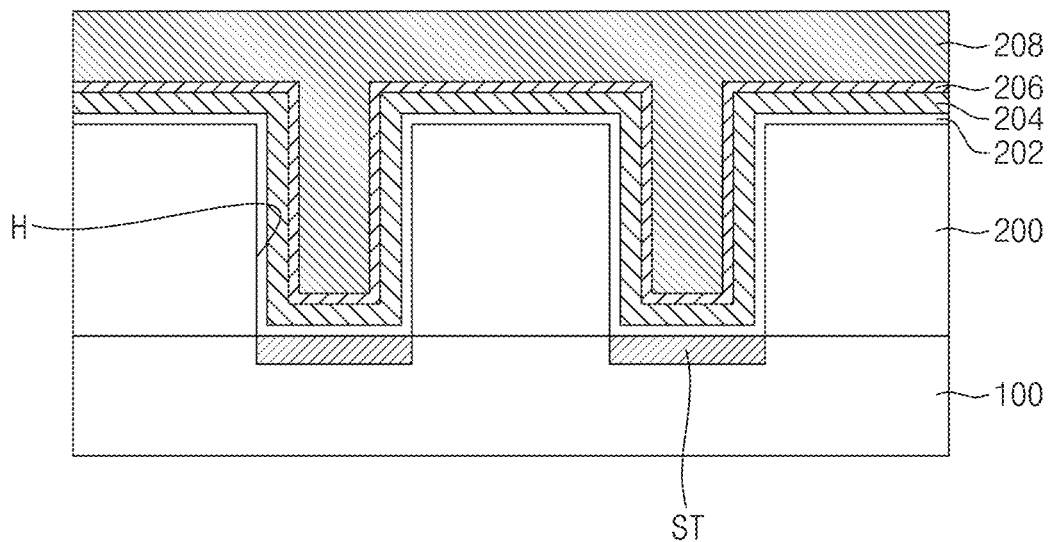

Referring to FIGS. 5 and 9, a metal layer 208 may be formed on the barrier layers 204 and 206. The metal layer 208, may be a W layer, may be formed, e.g., through atomic layer deposition (ALD) and/or chemical vapor deposition (CVD). Thereafter, node separation among contacts may be performed through a chemical mechanical polishing (CMP) process.

Figure 10:
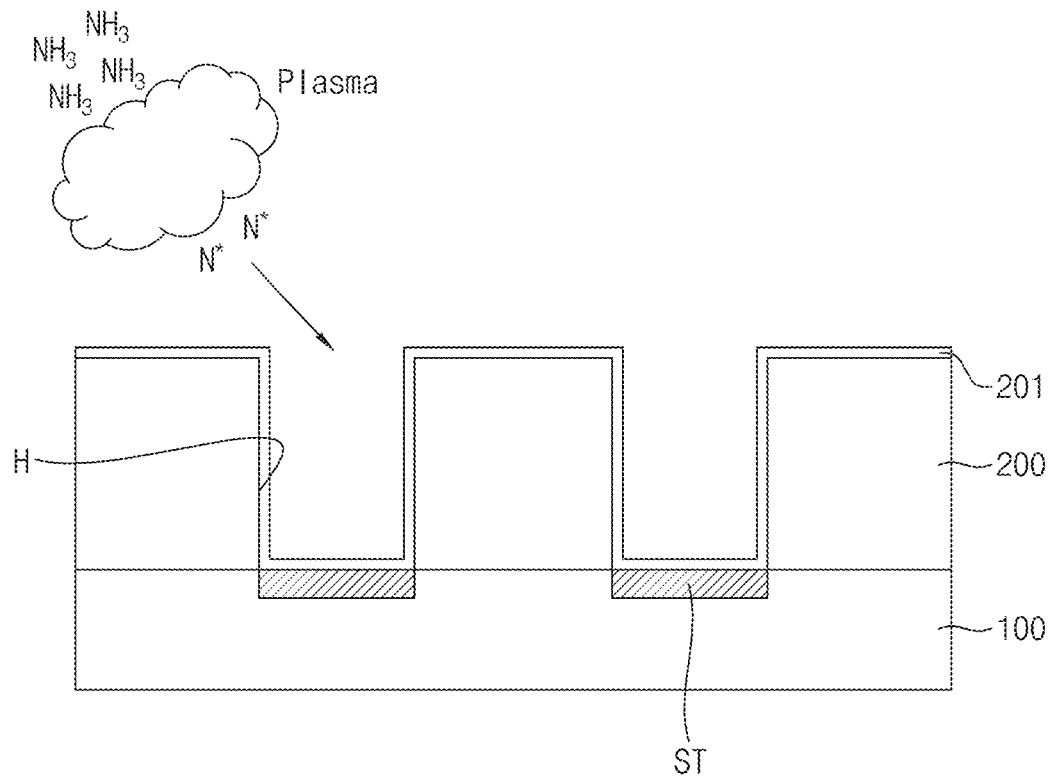
Figure 11:
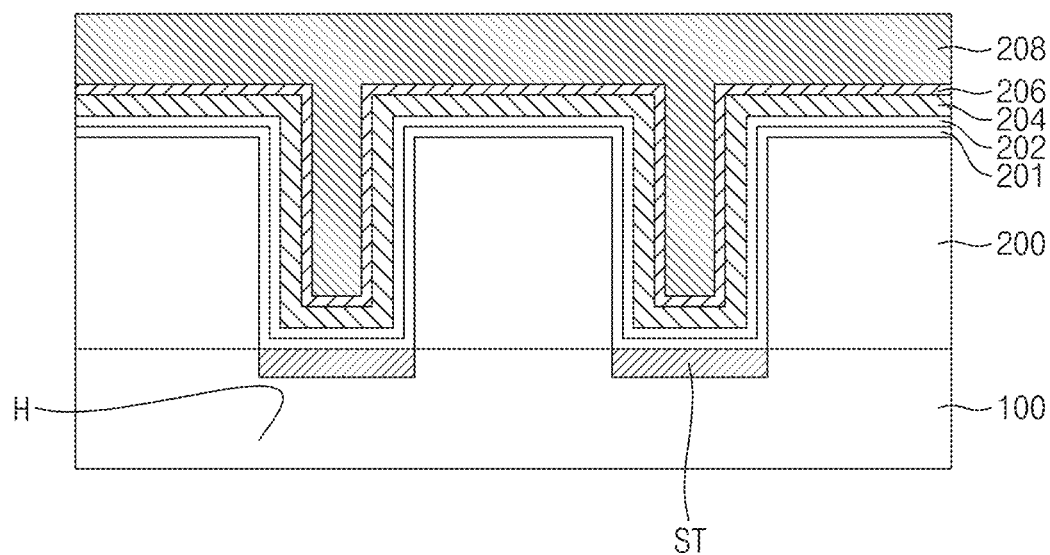

Referring to FIGS. 5, 10, and 11, in some example embodiments, an SiON layer 201 may be further formed on the interlayer insulating layer 200 through plasma nitrification treatment. Subsequently, a dielectric layer 202, which is a $TiO_2$ layer, a first barrier layer 204, which is a Ti layer, a second barrier layer 206, which is a TiN layer, and a metal layer 208, which is a W layer, may be sequentially stacked on the SiON layer 201 by performing the processes described with reference to FIGS. 7 to 9 after the plasma nitrification treatment. In an embodiment, the dielectric layer 202, which is a $TiO_2$ layer, may not be formed. In this case, the first barrier layer 204, which is a Ti layer, may be directly formed on the SiON layer 201.

Figure 12:
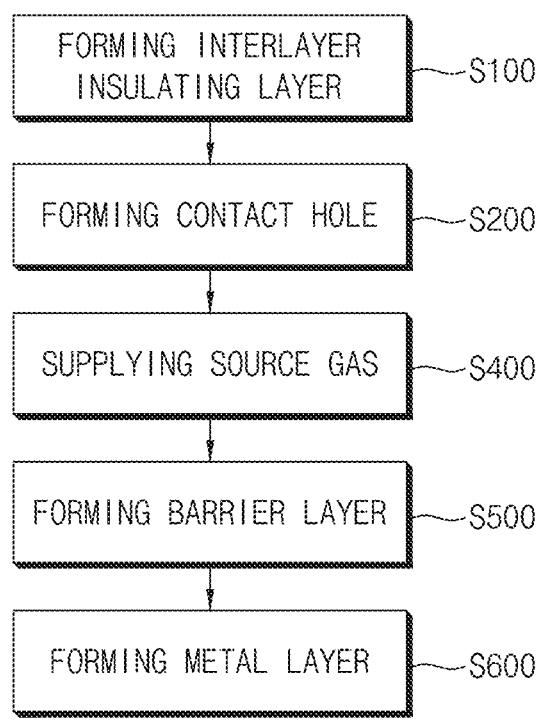
FIG. 12 is a flowchart explaining a method for forming a contact of a semiconductor device in accordance with some example embodiments.

FIG. 12 is a flowchart explaining a method for forming a contact of a semiconductor device in accordance with an exemplary embodiment of the disclosure.

Referring to FIG. 12, the method may omit the plasma nitrification treatment performed in the contact formation method described with reference to FIG. 5. That is, the method may adjust the thickness of a $TiO_2$ layer, which is a dielectric layer 202, by supplying $TiCl_4$ onto an interlayer insulating layer 200, which is silicon oxide, under the condition that the partial pressure of TiCl$_4$ is adjusted. For example, the TiO$_2$ layer may be formed to have a thickness of about 3 to 6 Å by adjusting the partial pressure of TiCl$_4$ such that the partial pressure ratio TiCl$_4$/H$_2$ of TiCl$_4$ and H$_2$ in a chamber is in a range of 1/750 to 1/250.

Figure 13:
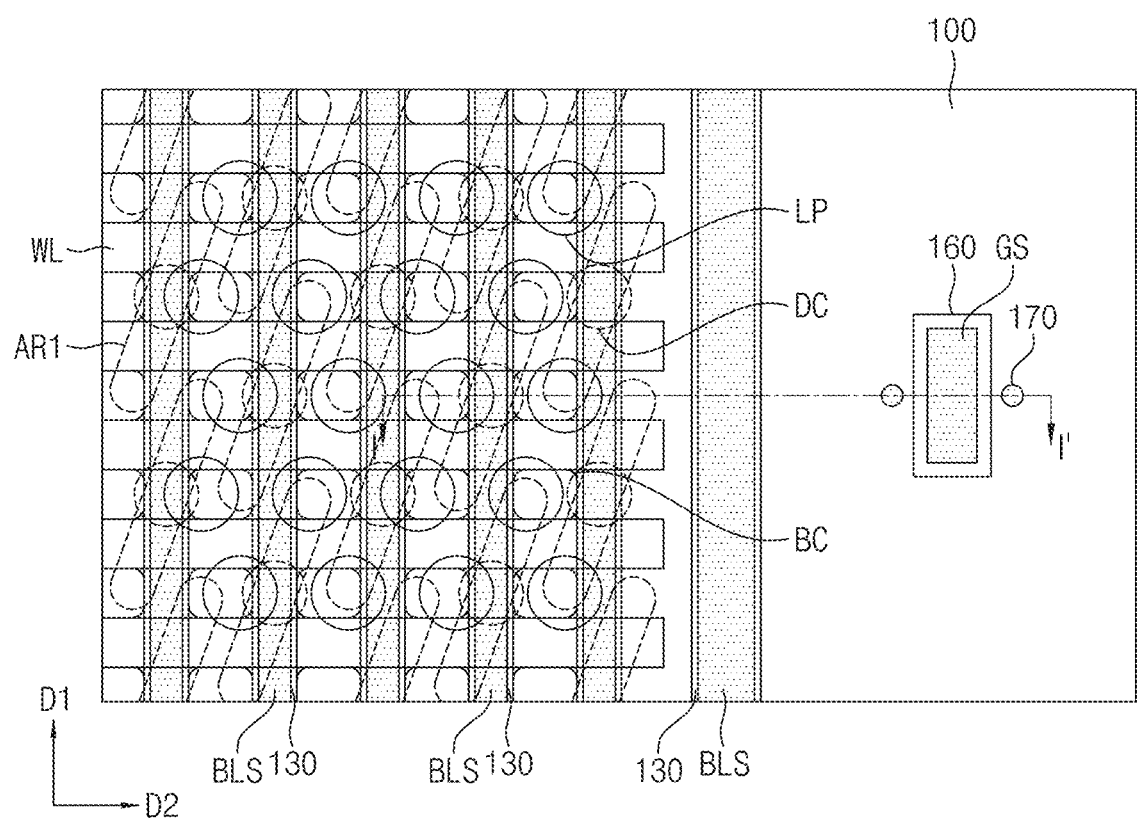
FIG. 13 is a schematic plan view of a semiconductor device including a contact according to some example embodiments.
Figure 14:
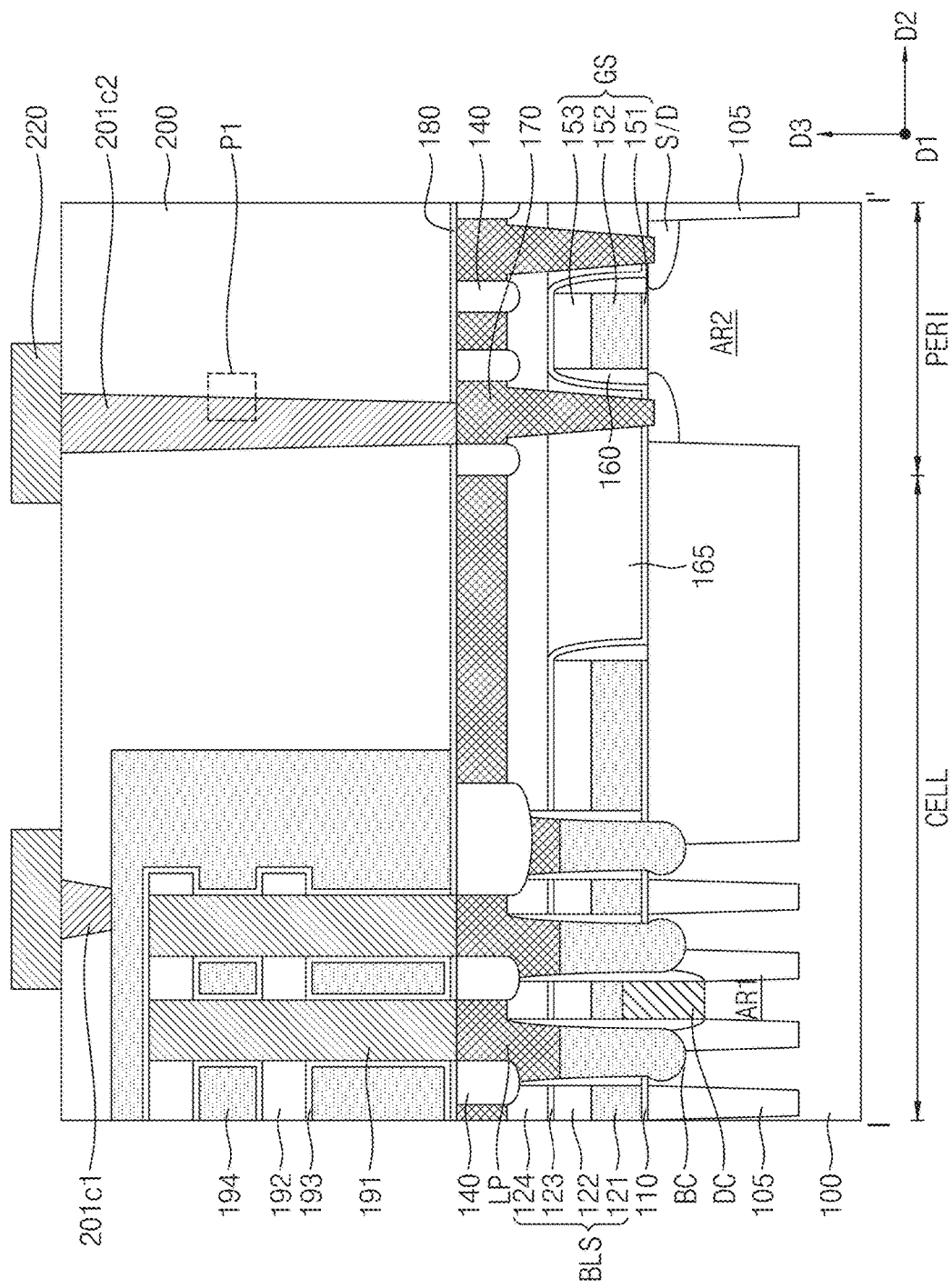
FIG. 14 is a cross-sectional view taken along line I-I' in FIG. 13.
Figure 15:
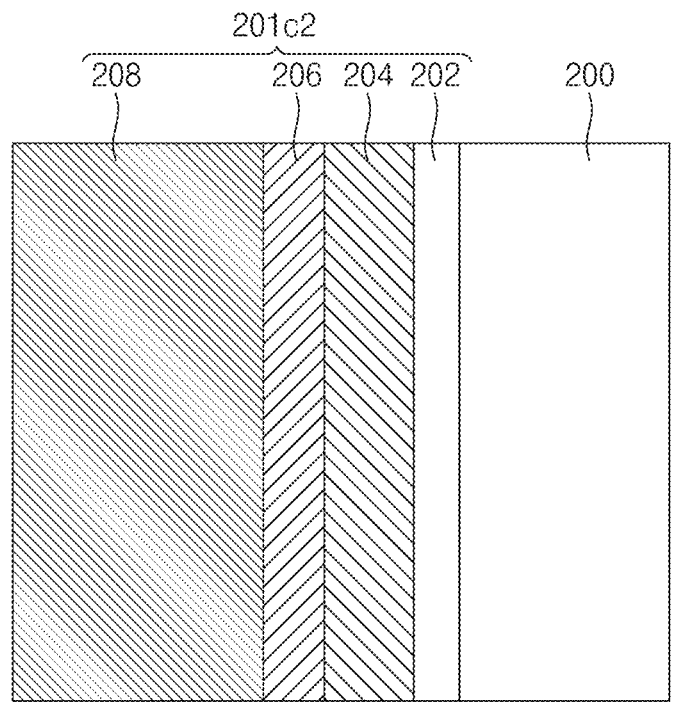
FIGS. 15 and 16 are enlarged views of a portion P1 of FIG. 14.
Figure 16:
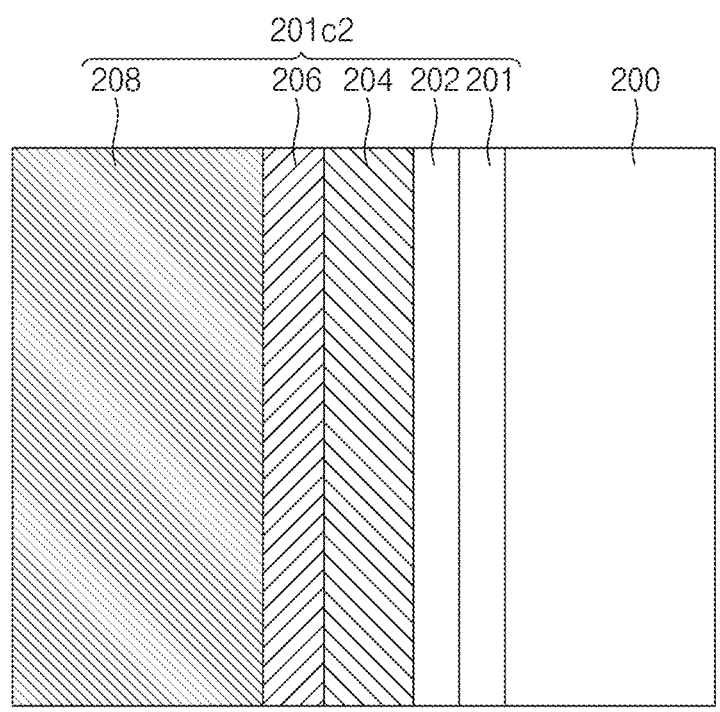

FIG. 13 is a schematic plan view of a semiconductor device including a contact according to an exemplary embodiment of the disclosure. FIG. 14 is a cross-sectional view taken along line I-I' in FIG. 13. For convenience of description, the plan view of FIG. 13 is shown in a state in which a contact is omitted. FIGS. 15 and 16 are enlarged views of a portion P1 of FIG. 14.

Referring to FIGS. 13 and 14, the semiconductor device may include a semiconductor substrate 100, a word line WL, a buffer layer 110, a bit line structure BLS, a direct contact DC, an insulating spacer 130, a buried contact BC, a landing pad LP, an insulating structure 140, a gate structure GS, a contact plug 170, a first interlayer insulating layer 165, a lower electrode 191, a supporter layer 192, a capacitor dielectric layer 193, an upper electrode 194, a second interlayer insulating layer 200, -contacts 201c1/201c2, and a wiring layer 220.

The semiconductor substrate 100 may include a cell area CELL and a peripheral circuit area PERI. The cell area CELL may be an area in which a memory cell of a DRAM device is disposed, and the peripheral circuit area PERI may be a core/peri area. The semiconductor substrate 100 may include a semiconductor material. For example, the semiconductor substrate 100 may be and/or include a silicon substrate, a germanium substrate, a silicon germanium substrate, a silicon-on-insulator (SDI) substrate, and/or the like.

The semiconductor substrate 100 may include a first active region AR1, a second active region AR2, and an element isolation layer 105. The element isolation layer 105 may be an insulating layer buried in the semiconductor substrate 100, and may define first active regions AR1 in the cell area CELL. The first active region AR1 may have the form of an island surrounded by the element isolation layer 105. The first active regions AR1 may have the form of bars having a shorter axis and a longer axis while being spaced apart from one another. The element isolation layer 105 may define the second active region AR2 in the peripheral circuit area PERI. The element isolation layer 105 may distinguish the cell area CELL and the peripheral circuit area PERI from each other.

Word lines WL may be disposed in parallel while being spaced apart from one another in a first direction D1, and each of the word lines WL may extend in a second direction D2 perpendicularly intersecting the first direction D1. The first direction D1 and the second direction D2 may perpendicularly intersect each other on a plane parallel to a top surface of the semiconductor substrate 100. The word lines WL may intersect the first active regions AR1. For example, two word lines WL may intersect one first active region AR1. The word lines WL may be buried in the semiconductor substrate 100.

The buffer layer 110 may be disposed between the semiconductor substrate 100 and the bit line structure BLS. The buffer layer 110 may cover a portion of the top surface of the semiconductor substrate 100 and a portion of a top surface of the element isolation layer 105. For example, the buffer layer 110 may include silicon nitride.

Bit line structures BLS may extend in the first direction D1 while being disposed in parallel and spaced apart from one another in the second direction D2. The bit line structure BLS may include a conductive layer 121, a first capping layer 122, an insulating liner 123 and a second capping layer 124 which are sequentially stacked on the buffer layer 110. Although the conductive layer 121 is shown as being a single layer, for convenience of description, the conductive layer 121 may include multiple layers. The first capping layer 122 may be disposed on the conductive layer 121, and the conductive layer 121 and the first capping layer 122 may have the same width in the second direction D2. The insulating liner 123 may cover the first capping layer 122 in the cell area CELL, and may extend to the peripheral circuit area PERI. The second capping layer 124 may cover at least a portion of the insulating liner 123. The second capping layer 124 may extend to the peripheral circuit area PERI. The conductive layer 121 may include, e.g., at least one of polysilicon, TiN, TiSiN, W, tungsten silicide, and/or the like. Each of the first capping layer 122, the insulating liner 123, and the second capping layer 124 may include, e.g., at least one of silicon oxide, silicon nitride, silicon oxynitride, and/or the like.

The direct contact DC may be disposed at a lower portion of the bit line structure BLS in a region where the bit line structure BLS contacts the first active region AR1. For example, the direct contact DC may fill a portion of a recess formed at the top surface of the substrate 100. When viewed in a top (and/or plan) view, the direct contact DC may overlap with a central portion of the first active region AR1. The direct contact DC may electrically interconnect the first active region AR1 and the bit line structure BLS. For example, the direct contact DC may include a conductive material, e.g., polysilicon.

Insulating spacers 130 may be disposed at opposite side surfaces of the bit line structures BLS, respectively, and may extend along corresponding ones of the bit line structure BLS in the first direction D1, respectively. A portion of the insulating spacer 130 may extend into the recess of the semiconductor substrate 100, and may cover a side surface of the direct contact DC. The insulating spacers 130 may include a single layer and/or multiple layers and may comprise an insulating material.

The buried contact BC may be disposed among the bit line structures BLS. The buried contact BC may be disposed among the insulating spacers 130. A lower portion of the buried contact BC may extend into the semiconductor substrate 100 and, as such, may contact the first active region AR1. For example, the buried contact BC may include a conductive material, e.g., polysilicon.

The landing pad LP may be connected to an upper end of the buried contact BC, and a portion of the land pad LP may be disposed on the bit line structure BLS. The landing pad LP may be electrically connected to the first active region AR1 via the buried contact BC. Insulating structures 140 may be disposed among landing pads LP. The insulating structures 140 may electrically insulate the landing pads LP from one another. Top surfaces of the insulating structures 140 may be coplanar with a top surface of the landing pad LP. For example, the landing pad LP may include a conductive material, e.g., tungsten, and the insulating structure 140 may include an insulating material, e.g., silicon oxide.

The gate structure GS may be disposed on the second active region AR2 in the peripheral circuit area PERI. A source/drain region S/D may be disposed at a top surface of the second active region AR2 adjacent to the gate structure GS. The gate structure GS may include a gate dielectric layer 151, a gate electrode 152, and a gate capping layer 153 which are sequentially stacked on the second active region AR2. Although the gate electrode 152 is shown as being a single layer, the gate electrode 152 may include multiple layers, and may include the same material as the conductive layer 121 of the bit line structure BLS.

Gate spacers 160 may be disposed on side walls of the gate structure GS. When viewed in a plan view, the gate spacer 160 may surround the gate structure GS. The gate spacer 160 and the gate structure GS may be covered by the insulating liner 123 extending from the cell area CELL. The gate spacer 160 may include an insulating material, e.g., silicon oxide, silicon nitride, silicon oxynitride, and/or a combination thereof.

The first interlayer insulating layer 165 may be disposed on the insulating liner 123 in the cell area CELL and the peripheral circuit area PERI. The first interlayer insulating layer 165 may be disposed under the second capping layer 124. The interlayer insulating layer 165 may be disposed on a side surface of the gate spacer 160. The first interlayer insulating layer 165 may include an insulating material, e.g., silicon oxide, silicon nitride, silicon oxynitride, and/or a combination thereof.

In the peripheral circuit area PERI, the contact plug 170 may be disposed adjacent to the gate structure GS. The contact plug 170 may extend through the first interlayer insulating layer 165 and the second capping layer 124 and, as such, may contact the second active region AR2. A top surface of the contact plug 170 may be disposed at the same level as the top surface of the landing pad LP. The contact plug 170 may include the same material as the landing pad LP. Upper portions of contact plugs 170 may have the form of lines extending in a horizontal direction or islands spaced apart from one another. The insulating structures 140 may electrically insulate the contact plugs 170.

An etch stop layer 180 may be disposed on the landing pad LP, the insulating structure 140, and the contact pug 170. For example, the etch stop layer 180 may include an insulating material, e.g., silicon nitride. The etch stop layer 180 may have etch selectivity, for example, compared to the insulating structure 140.

A capacitor structure may be disposed on the landing pad LP in the cell area CELL. The capacitor structure may include a lower electrode 191, a supporter layer 192, a capacitor dielectric layer 193, and an upper electrode 194. Lower electrodes 191 may extend through the etch stop layer 180 and, as such, may be connected to corresponding ones of the landing pads LP, respectively. The lower electrode 191 may have a cylindrical shape, a cup shape, a pillar shape, and/or a hybrid shape (e.g., including both the cylindrical shape and the pillar shape). The lower electrode 191 may include, e.g., a conductive materials such as a metal (e.g., Ti, W, Ni and/or Co) and/or a metal nitride (e.g., TiN, TiSiN, TiAlN, TaN, TaSiN, WN, etc.). The supporter layer 192 may be connected to portions of side surfaces of the lower electrodes 191 and, as such, may prevent (and/or mitigate the potential for) a collapse of the lower electrodes 191. The supporter layer 192 may include an insulating material, e.g., silicon nitride.

The capacitor dielectric layer 193 may be conformally formed along surfaces of the lower electrode 191 and the supporter layer 192. The capacitor dielectric layer 193 may include and insulating material such as a metal oxide (e.g., at least one of $HfO_2$, $ZrO_2$, $Al_2O_3$, $La_2O_3$, $Ta_2O_3$, and/or $TiO_2$), a dielectric material having a perovskite structure (e.g., $SrTiO_3$(STO), $BaTiO_3$, lead-zirconium-titanate ("PZT") and/or lead-lanthanum-zirconium-titanate ("PLZT")), and/or a combination thereof.

The upper electrode 194 may be disposed on the capacitor dielectric layer 193 and, as such, may cover the lower electrode 191. The upper electrode 194 may include a conductive material, and SiGe covering the conductive material. The conductive material may include, for example, a metal (such as Ti, W, Ni and Co) and/or a metal nitride) such as TiN, TiSiN, TiAlN, TaN, TaSiN, WN, etc.).

The second interlayer insulating layer 200 may be disposed on the etch stop layer 180 in the cell area CELL and the peripheral circuit area PERI. The second interlayer insulating layer 200 may cover the upper electrode 194. The second interlayer insulating layer 200 may include an insulating material, e.g., silicon oxide.

The contacts 201$c$1/201$c$2 may be electrically connected to a transistor in the cell area CELL and/or the peripheral circuit area PERI. The contacts 201$c$1/201$c$2 may include a first contact 201$c$1 and a second contact 201$c$2. The first contact 201$c$1 may extend through the second interlayer insulating layer 200 in the cell area CELL and, as such, may be connected to the upper electrode 194. The second contact 201$c$2 may extend through the second interlayer insulating layer 200 and the etch stop layer 180 in the peripheral circuit area PERI and, as such, may be connected to the contact plug 170. The first contact 201$c$1 and the second contact 201$c$2 may be made of the same material, and may have the same configuration.

Wiring layers 220 may be disposed on the second interlayer insulating layer 200 and respective contacts 201$c$1 and 201$c$2. Although not shown, a third contact may be electrically connected to the bit line structure BLS. The third contact may be formed using the same material as the first and second contacts 201$c$1 and 201$c$2, and may have the same configuration as the first and second contacts 201$c$1 and 201$c$2. The contact 201$c$1/201$c$2 may be formed through any one of the contact formation methods described with reference to FIGS. 5 to 12.

Referring to FIGS. 14 and 15, the second contact 201$c$2 may include a dielectric layer 202 being a $TiO_2$ layer, a first barrier layer 204 (e.g., a Ti layer), a second barrier layer 206 (e.g., a TiN layer), and a metal layer 208 (e.g., a W layer) which are sequentially stacked on a second interlayer insulating layer 200. Here, when plasma nitrification treatment and adjustment of the partial pressure of $TiCl_4$ are performed upon forming the contact 201$c$1/201$c$2, the thickness of the dielectric layer 202 may be 2.5 Å or less, and/or the dielectric layer 202 may not be formed at all. When only the plasma nitrification treatment is performed without adjustment of the partial pressure of $TiCl_4$, the dielectric layer 202 may be formed to have a thickness of 3 to 8 Å. When adjustment of the partial pressure of $TiCl_4$ is performed without plasma nitrification treatment, the dielectric layer 202 may be formed to have a thickness of 3 to 6 Å.

Referring to FIG. 16, in some example embodiments, the second contact 201$c$2 may further include an SiON layer 201. The SiON layer 201 may be interposed between the second interlayer insulating layer 200 and the dielectric layer 202.

In accordance with the example embodiments of the disclosure, the thickness of a dielectric layer formed by plasma enhanced chemical vapor deposition (PECVD) for formation of a barrier layer, upon forming a contact of a DRAM device, may be adjusted and, as such, it may be possible to adjust RC delay of the DRAM device.

While the example embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A method of forming a contact, the method comprising:
   providing a semiconductor substrate comprising a silicon oxide film to an interior of a chamber;
   supplying a source gas including TiCl4 and H2 to the interior of the chamber; and
   forming a barrier layer by igniting a plasma using the source gas.

2. The method according to claim 1, wherein the supplying the source gas comprises forming a dielectric layer on the silicon oxide film.

3. The method according to claim 2, wherein the dielectric layer comprises a TiO2 layer.

4. The method according to claim 3, the forming the TiO2 layer includes adjusting a thickness of the TiO2 layer by adjusting a partial pressure of the TiCl4 to a level and maintaining the level.

5. The method according to claim 4, wherein a partial pressure ratio TiCl4/H2 of source case is 1/750 to 1/250.

6. The method according to claim 5, wherein the TiO2 layer is formed to have a thickness of 3 Å to 6 Å.

7. The method according to claim 4, wherein a partial pressure ratio TiCl4/H2 of source case is 1/250 to 1/150.

8. The method according to claim 1, wherein the barrier layer comprises a Ti layer.

9. The method according to claim 1, further comprising:
   forming a metal layer on the barrier layer.

10. The method according to claim 9, wherein the metal layer comprises a W layer.

* * * * *